United States Patent
Zhang

(10) Patent No.: US 10,454,419 B2
(45) Date of Patent: Oct. 22, 2019

(54) HYBRID RESONATOR BASED VOLTAGE CONTROLLED OSCILLATOR (VCO)

(71) Applicant: Cemin Zhang, Diamond Bar, CA (US)

(72) Inventor: Cemin Zhang, Diamond Bar, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 243 days.

(21) Appl. No.: 15/447,764

(22) Filed: Mar. 2, 2017

(65) Prior Publication Data

US 2018/0145630 A1    May 24, 2018

(30) Foreign Application Priority Data

Nov. 21, 2016   (CN) ............................ 2016 1 1039626

(51) Int. Cl.
*H03B 5/12*      (2006.01)
*H01L 23/00*     (2006.01)
*H01L 23/66*     (2006.01)
*H03B 7/06*      (2006.01)

(52) U.S. Cl.
CPC ........... *H03B 5/1231* (2013.01); *H01L 23/66* (2013.01); *H01L 24/15* (2013.01); *H03B 5/1203* (2013.01); *H03B 5/1243* (2013.01); *H03B 5/1262* (2013.01); *H03B 7/06* (2013.01)

(58) Field of Classification Search
CPC .... H03B 5/124; H03B 5/1234; H03B 5/1231; H03B 5/1203; H03B 5/1262; H03B 5/1243; H03B 7/06; H01L 27/0255; H01L 24/15; H01L 23/66

USPC ....... 331/175, 183, 185, 167, 117 FE, 177 V, 331/117 R, 179

See application file for complete search history.

(56) References Cited

U.S. PATENT DOCUMENTS

| | | | |
|---|---|---|---|
| 3,662,287 A * | 5/1972 | Egbert | ................... H03B 19/05 331/117 R |
| 4,378,532 A | 3/1983 | Burgoon | |
| 4,536,724 A | 8/1985 | Hasegawa et al. | |
| 4,621,241 A | 11/1986 | Kiser | |
| 5,469,117 A | 11/1995 | Philippe | |
| 6,504,443 B1 | 1/2003 | Eguizabal | |
| 8,957,738 B1 * | 2/2015 | Koechlin | ............. H03B 5/1293 331/117 R |

* cited by examiner

*Primary Examiner* — Arnold M Kinkead
(74) *Attorney, Agent, or Firm* — North Weber & Baugh LLP

(57) ABSTRACT

The invention discloses a voltage controlled oscillator (VCO) based on hybrid resonator, including a hybrid resonator and a negative resistance circuit, wherein the hybrid resonator includes the first LC series resonance branch, the second LC series resonance branch and the third LC series resonance branch. The first LC series resonance branch and the second LC series resonance branch forms a parallel structure, in which one end of the said parallel structure is grounded while the other end is connected to the third LC series resonance branch, and the other end of the third LC series resonance branch is connected to the negative resistance circuit. The resonance frequency of the first LC series resonance branch is lower than that of the second LC series resonance branch. The invented VCO can effectively improve the phase noise, especially maintain a good phase noise with the increase of the tuning frequency.

18 Claims, 3 Drawing Sheets

HYBRID RESONATOR BASED VOLTAGE CONTROLLED OSCILLATOR (VCO)

CROSS-REFERENCE TO RELATED APPLICATIONS

This application claims foreign priority to Chinese Patent Application No. 201611039626.9, entitled "HYBRID RESONATOR BASED VOLTAGE CONTROLLED OSCILLATOR (VCO)," naming Cemin Zhang as inventor, and filed Nov. 21, 2016, the subject matter of which is hereby incorporated herein by reference in its entirety.

BACKGROUND

Field of Invention

The invention relates to radio frequency technology, in particular, to voltage controlled oscillator (VCO) based on hybrid resonator.

Background of Invention

A voltage controlled oscillator (VCO) is one of the key components of Radio Frequency (RF) and microwave devices, which often consists of a negative resistance circuit and a resonant circuit. Traditionally the resonant circuit is LC series resonator having an inductor and a capacitor put in series, in which one end of the LC resonator is connected to the negative resistance circuit, and the other end is grounded. Since the quality factor (Q value) of the resonator normally decreases as the increase of tuning frequency, the phase noise of VCO normally gets worse with the increase of tuning frequency while in use. Therefore, how to design a VCO that is able to maintain low phase noise at higher tuning frequency has become a well-known issue. However, there is no corresponding device available and no related invention from prior art that can effectively resolve such issue.

DESCRIPTION OF INVENTION

It is therefore an object of this invention to maintain low phase noise with the increase of tuning frequency through providing an improved voltage controlled oscillator (VCO) based on hybrid resonator.

This invention solves the above-mentioned issue mainly through the following technical scheme: the VCO based on hybrid resonator comprises a hybrid resonator and a negative resistance circuit; wherein, the said hybrid resonator includes the first LC series resonance branch, the second LC series resonance branch and the third LC series resonance branch; the said first LC series resonance branch and the said second LC series resonance branch form a parallel structure; wherein, one end of the said parallel structure is grounded while the other end of the said parallel structure is connected to one end of the said third LC series resonance branch, and the other end of the said third LC series resonance branch is connected to the negative resistance circuit; and the resonance frequency of the said first LC series resonance branch is lower than that of the said second LC series resonance branch. While the invention is in use, if relatively low tuning frequency signal is generated, the signal mainly flows through the first LC series resonance branch, and the signal increasingly flows through the second LC series resonance branch with the increase of tuning frequency.

Further, in order to increase the frequency tuning range of this invention, the said first LC series resonance branch includes a multistage LC series resonance cell cascaded structure in which each stage of the LC series resonance cell consists of a capacitor and a fixed inductor; and the said second LC series resonance branch also includes a multistage LC series resonance cell cascaded structure in which each stage of the LC series resonance cell consists of a capacitor and a fixed inductor.

Further, each capacitor in the said first LC series resonance branch and the said second LC series resonance branch includes one of the following forms: a fixed capacitor, a variable capacitor composed of a varactor, or a variable capacitor composed of back-to-back varactors, or a switched capacitor controlled by switch, or a variable capacitor composed of a fixed capacitor and a variable capacitor in parallel.

Further, the capacitors in the first LC series resonance branch are variable capacitors composed of varactor diodes, and the capacitors of the second LC series resonance branch are fixed capacitors. Quality factor (Q value) of both the fixed capacitor and the variable capacitor composed of varactor diode would decrease as the increase of tuning frequency; therefore, the phase noise of the VCO based on traditional LC resonator often gets worse with the increase of tuning frequency. Besides, the quality factor of the fixed capacitor is far superior compared to that of the variable capacitor composed of varactor diode, in order to provide enough tuning bandwidth, the capacitors of the first LC series resonance branch include the variable capacitors such as varactor diodes, while the capacitors of the second LC series resonance branch are fixed capacitors. Since the resonance frequency of the first LC series resonance branch is relatively lower than that of the second LC series resonance branch, the overall Q value of the hybrid resonator would be dominated by the first LC series resonance branch while relatively lower tuning frequencies being generated, the second LC series resonance branch contributes more to the overall Q value while relatively higher tuning frequencies being generated compared to when the VCO operates under relatively low tuning frequencies. Utilizing the fixed capacitors with high Q value for the second LC series resonance branch could effectively maintain an overall high Q value of the hybrid resonator with the increase of tuning frequency, thus effectively resolve the above mentioned critical technical issue, i.e. the phase noise of VCO often gets worse with the increase of tuning frequency.

Further, the said negative resistance circuit includes the first NPN transistor, the fourth capacitor, the fifth capacitor, the third resistor and the fifth inductor. Wherein, the two ends of the said fourth capacitor are connected to the base and the emitter of the said first NPN transistor respectively; the collector of the said first NPN transistor is connected to an external power supply; the two ends of the said third resistor are connected to the emitter of the said first NPN transistor and the said fifth inductor respectively; opposite to the end which connects to the said third resistor, the other end of the fifth inductor is grounded; one end of the said fifth capacitor is connected to the junction between the said fourth capacitor and the emitter of the said first NPN transistor, while the other end of the fifth capacitor is grounded; one end of the third LC series resonance branch which connects to the negative resistance circuit is connected to the base of the said first NPN transistor. The negative resistance circuit of this invention includes a voltage divider composed of the active device (the first NPN transistor) and two capacitors (the fourth capacitor and the fifth capacitor), with the voltage across the said fourth capacitor providing voltage feedback, and the fifth inductor providing negative feedback for the said first NPN transistor.

The hybrid resonator of the present invention exhibits an overall inductance characteristics within its operating frequency range, equivalent to $L_{tot}$. The oscillation frequency of the present invention is determined by the parallel resonant circuit, which is composed of the said $L_{tot}$ in parallel to the series connected fourth and the fifth capacitors. The final oscillation frequency ($f_0$) is generally determined by the resonance frequency of the equivalent inductance ($L_{tot}$) with the said fourth and fifth capacitors, whose calculation formula is as follows:

$$f_0 = \frac{1}{2\pi \sqrt{L_{tot}\left(\frac{C_4 C_5}{C_4 + C_5}\right)}}$$

While in use, the voltage feedback and the negative resistance value of the invented VCO can be controlled by adjusting the values of the said fourth capacitor and fifth capacitor.

Further, the said negative resistance circuit includes the first resistor, the second resistor and the fourth inductor. Wherein, one end of the said fourth inductor is connected to the junction between the third LC series resonance branch and the base of the first NPN transistor, while the other end is connected to the first resistor; opposite to the end of the said first resistor which connects to the said fourth inductor, the other end of the said first resistor is connected to an external power supply; one end of the said second resistor is connected to the junction between the first resistor and the fourth inductor, while the other end is grounded. Further, the said first resistor and second resistor are both DC bias resistors which provide DC bias for the normal operation of the first NPN transistor; and the said fourth inductor is the isolation inductor between the resonant circuit and the said DC bias, which is considered as a high resistance path at RF frequencies, and a low resistance path under the condition of DC.

Further, the said negative resistance circuit includes the sixth capacitor. Wherein, one end of the said sixth capacitor is connected to the power supply, while the other end of the said sixth capacitor is grounded. The said sixth capacitor is used to filter out the noise introduced by the external power supply as a decoupling capacitor.

Two of the above mentioned single-ended VCO are configured to form a push-push VCO structure in which the output is connected to a buffer amplifier or a frequency multiplier. In this invention, the push-push VCO structure includes two identical single-ended voltage controlled oscillators with balanced structure, and the output terminal of the said buffer amplifier or the said frequency multiplier serves as the RF output of the said push-push VCO. Due to its balanced structure, the resonator suppresses the odd harmonics at symmetrical centerline, which could be served as the virtual ground for the odd harmonics (including the fundamental signal component). The resonator also contains constructive second harmonic components at the said symmetrical centerline, which could be served as the output of the second harmonic or the ×2 frequency signal.

Two of the above mentioned single-ended VCO are configured to form a differential VCO structure.

To sum up, this invention has the following beneficial features: (1) It has a simple structure, uses fewer components and achieves a low-cost implementation; while functioning, if relatively low resonance frequency signal is generated, the signal in the hybrid resonator mainly flows through the first LC series resonance branch, and more signal flows through the second LC series resonance branch with higher Q value than that of the first LC series resonance branch if relatively high resonance frequency signal is generated, thus maintains a low phase noise with the increase of tuning frequency.

(2) By configuring two identical single-ended voltage controlled oscillators with hybrid resonator to form a push-push VCO structure, the phase noise performance and the maximum operating frequency are improved.

BRIEF DESCRIPTION OF THE DRAWINGS

As a part of this application, the accompanying drawings descried hereinafter are used to provide further understanding for the embodiments of the invention, and shall not constitute a restriction on the said embodiments. Among the accompany drawings.

The marks in the accompanying drawings and their corresponding part appellations are as follow: L1—the first inductor, L2—the second inductor, L3—the third inductor, L4—the fourth inductor, L5—the fifth inductor, C1—the first capacitor, C2—the second capacitor, C3—the third capacitor, C4—the fourth capacitor, C5—the fifth capacitor, C6—the sixth capacitor, R1—the first resistor, R2—the second resistor, R3—the third resistor, Q1—the first NPN transistor, and A1—the buffer amplifier.

DETAILED DESCRIPTION OF PREFERRED EMBODIMENTS

The invention will now be described by the following embodiments and accompanying drawings to better elaborate its purposes as well as the advantages of its technical scheme. All the schematic implementation methods and their illustrations are only used to elaborate the invention, and shall not constitute a restriction on the invention.

Figure 1:
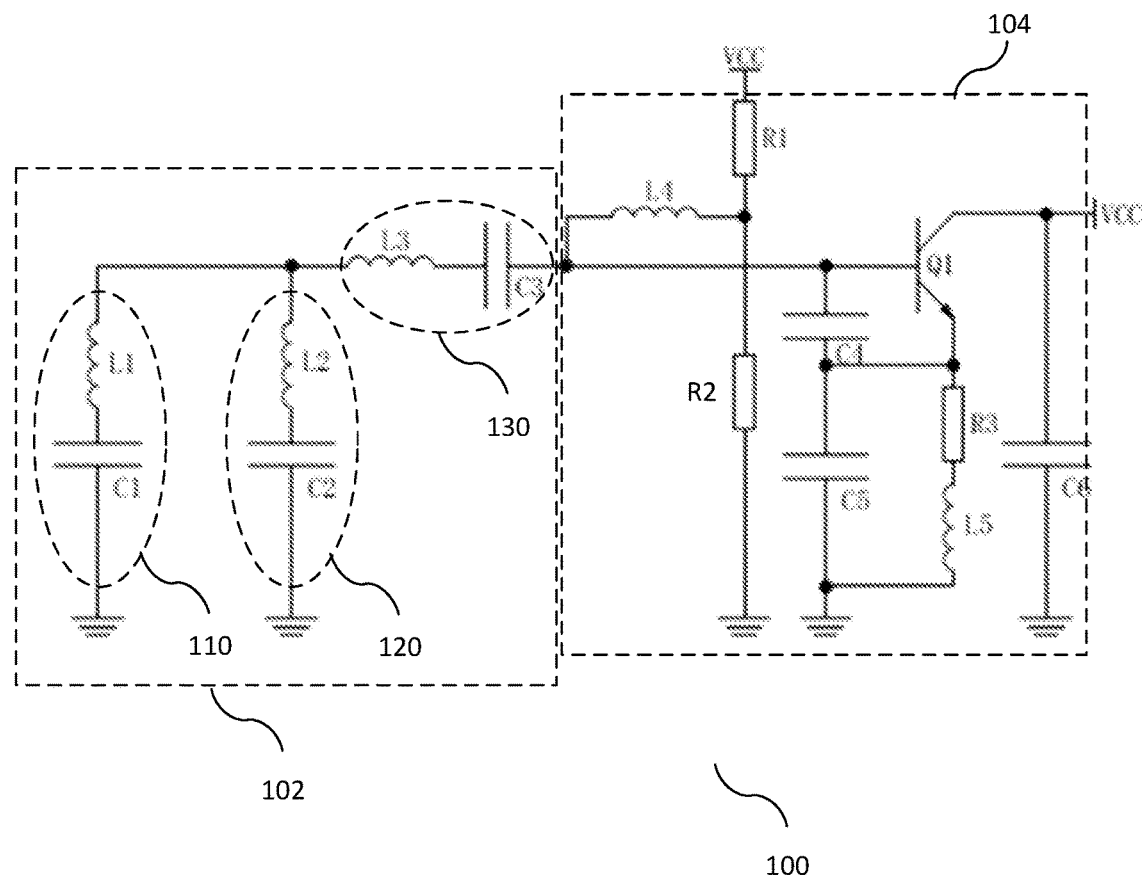
FIG. 1 is a circuit diagram of VCO applied in one preferred embodiment of this invention.

Embodiment 1:

As shown in FIG. 1, the hybrid resonator based VCO 100 comprises a hybrid resonator 102 and a negative resistance circuit 104. Wherein, the hybrid resonator includes a first LC series resonance branch 110, a second LC series resonance branch 120 and a third LC series resonance branch 130. Wherein, the first LC series resonance branch 110 forms a parallel structure with the second LC series resonance branch 120; one end of the parallel structure is grounded, while the other end is connected to one end of the third LC series resonance branch 130; opposite to the end of the third LC series resonance branch 130 which connects to the parallel structure formed by the first LC series resonance branch and the second LC series resonance branch, the other end of the third LC series resonance branch 130 is connected to the negative resistance circuit 104. In this embodiment, the first LC series resonance branch includes a first inductor L and a first capacitor C1, the second LC series resonance branch includes a second inductor L2 and a second capacitor C2, and the third LC series resonance branch includes a third inductor L3 and a third capacitor C3; wherein, the inductance value of the first inductor L1 is greater than that of the second inductor L2, and the capacitance value of the first capacitor C1 is greater than that of the second capacitor C2; thus, the resonance frequency of the first LC series resonance branch is lower than that of the second LC series resonance branch. Both the first capacitor C1 of the first LC series resonance branch and the second capacitor C2 of the second LC series resonance branch include one of the following forms: a fixed capacitor, or a variable capacitor composed of varactor diode, or a variable capacitor composed of back-to-back varactor diodes, or a switched capacitor controlled by switch, or a variable capacitor composed of a fixed capacitor and a variable capacitor in parallel. In some embodiments, other types of variable capacitors could be used instead of varactor diode, e.g. ferroelectric base capacitor, MEMs based analog or digitally switched capacitor and/or field effect transistor (FET) that uses the capacitance between the gate and source/drain channel of the FET. In the preferred embodiment of this invention, the first capacitor C1 includes a variable capacitor composed of varactor diode with a relatively lower quality factor (or Q value, a dimensionless parameter defining a resonator's band-width relative to its center frequency), and the second capacitor includes a fixed capacitor with a relatively higher quality factor, which effectively maintains an overall high Q value of the hybrid resonator with the increase of tuning frequency. In the preferred embodiment of this invention, the first capacitor is a variable capacitor and therefore, the first resonance frequency is a variable resonance frequency within a first frequency range. The second capacitor is a fixed capacitor and therefore, the second resonance frequency is a fixed resonance frequency, which is higher than the first frequency range entirely. In some embodiments, both LC series resonance branches adopt a variable capacitor and therefore each branch has a corresponding frequency range. The first frequency range corresponding the first resonance branch may be entirely lower than a second frequency range corresponding the second resonance branch. The value of the L3 and C3 in the third series LC resonance branch are chosen to control the resonance frequencies of the VCO. Meanwhile, C3 works as a DC decoupling capacitor which prevents the DC bias voltage at the base of Q1 from interfering the $1^{st}$ and the $2^{nd}$ LC series resonance branches. C3 can be a fixed capacitor, or a fixed capacitor in series with a variable capacitor. In the preferred embodiment of the current invention, the third capacitor C3 is a fixed capacitor with relatively much higher Q value compared to a variable capacitor. In some embodiments, the value of the C3 is greater than the values of the C1 and C2. Therefore, compared to the third resonance branch, the first resonance branch and the second resonance branch play a more important role in determining the center frequency and tuning range of the VCO.

While in use, this embodiment could configure two above mentioned single-ended voltage controlled oscillator to form a push-push (×2 frequency) VCO structure or a differential VCO structure; wherein, if a push-push VCO structure is formed, the output of the said push-push VCO is connected to a buffer amplifier or a frequency multiplier. This embodiment can be implemented on a planar monolithic substrate using GaAs-based or silicon-based substrate materials.

Figure 2:
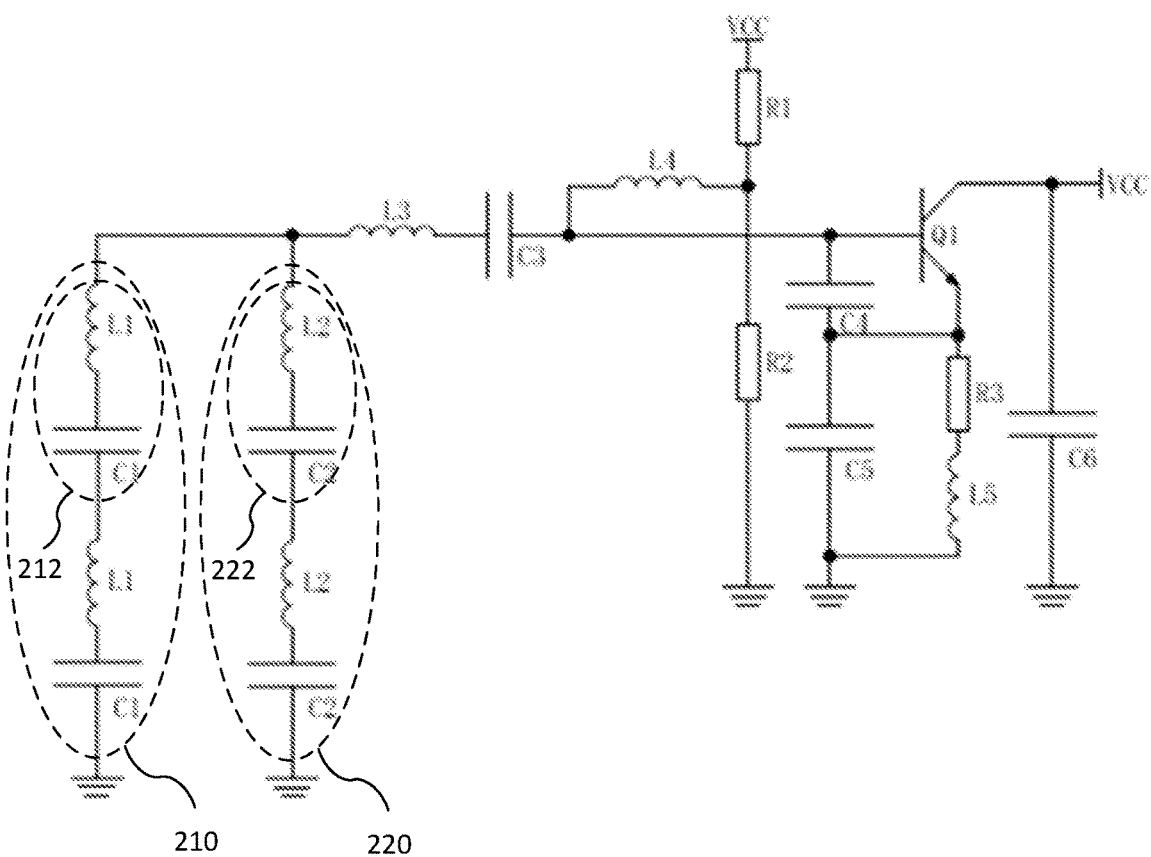
FIG. 2 is a circuit diagram of VCO applied in another preferred embodiment of this invention.

Embodiment 2:

In order to increase the frequency tuning range of the resonator, this embodiment makes further restrictions as follows on the basis of embodiment 1. Both the first LC series resonance branch 210 and the second LC series resonance branch 220 of this embodiment are implemented with multistage LC series resonance cell structure in which each stage of the LC series resonance cell 212 or 222 consists of a capacitor and a fixed inductor. The first LC series resonance branch and the second LC series resonance branch as shown in FIG. 2 both include two-stage LC series resonance cell structure. An advantage of cascading the first or the second resonance branch with multiple resonance cells is that, by distributing the applied high frequency voltage to the resonance branch among multistage resonance cells, each resonance cell receives less high frequency voltage. When a nonlinear variable capacitor is used in the resonance cell, the nonlinear modulation to the oscillator signal, which usually leads to worse phase noise, may be relieved.

Embodiment 3:

This embodiment makes further restrictions as follows on the basis of both embodiment 1 and embodiment 2. The said negative resistance circuit of this embodiment comprises the first NPN transistor Q1, the fourth capacitor C4, the fifth capacitor C5, the sixth capacitor C6, the third resistor R3 and the fifth inductor L5. Wherein, the two ends of the said fourth capacitor C4 are connected to the base and the emitter of the said first NPN transistor Q1 respectively; the collector of the said first NPN transistor Q1 is connected to an external power supply VCC; the two ends of the said third resistor R3 are connected to the emitter of the said first NPN transistor Q1 and the said fifth inductor L5 respectively; opposite to the end which connects to the said third resistor R3, the other end of the fifth inductor L5 is grounded; one end of the said fifth capacitor C5 is connected to the junction between the said fourth capacitor C4 and the emitter of the said first NPN transistor Q1, while the opposite end is grounded; the end of the third LC series resonance branch which connects to the negative resistance circuit is connected to the base of the said first NPN transistor Q1; one end of the sixth capacitor C6 is connected to the power supply VCC, while the other end of the sixth capacitor C6 is grounded.

Figure 3:
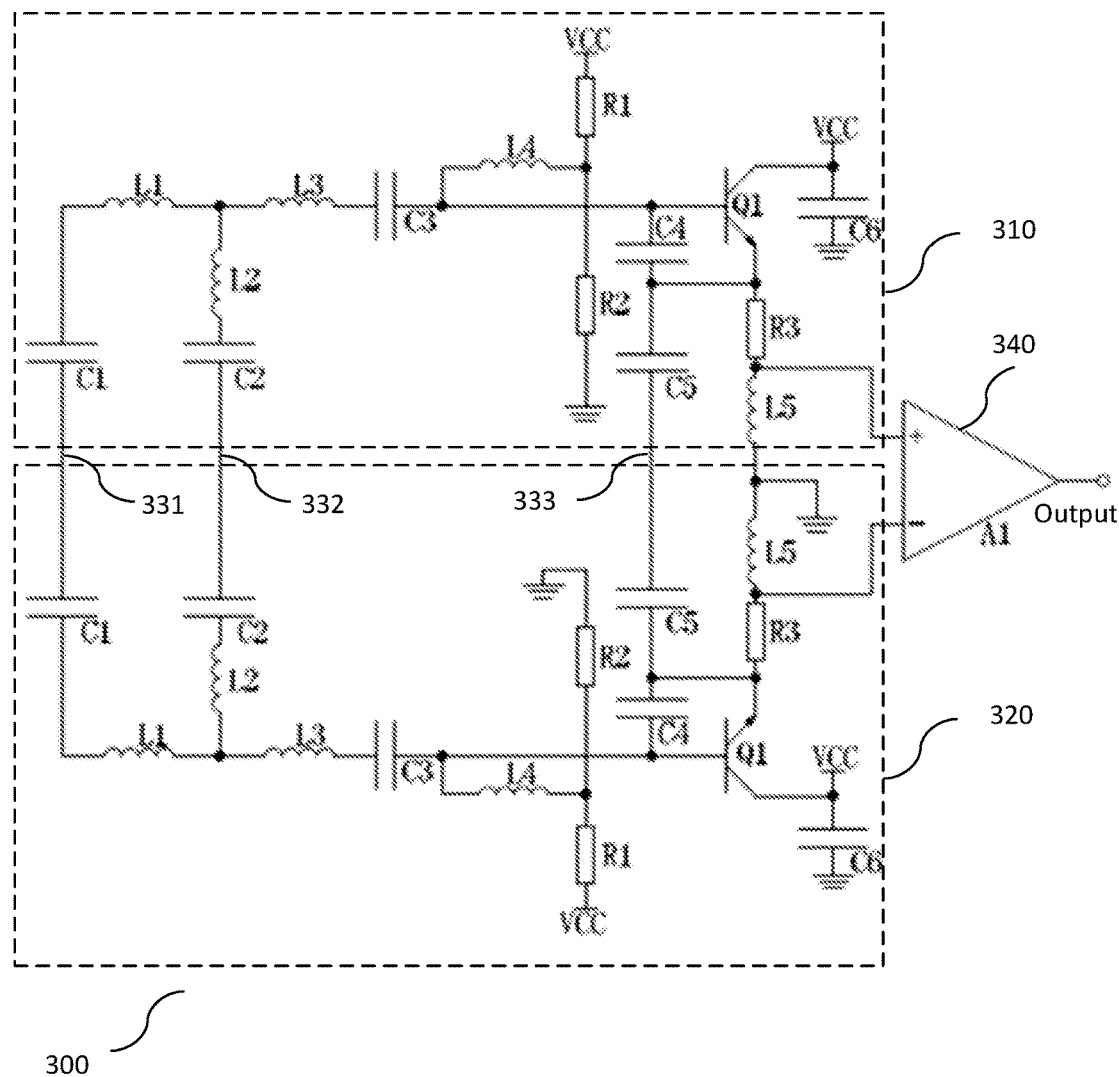
FIG. 3 shows a push-push (×2 frequency) VCO formed by the single-ended voltage controlled oscillators as shown in FIG. 1.

As shown in FIG. 3 of this embodiment, the push-push (×2 frequency) VCO structure 300 is formed by having two single-ended voltage controlled oscillators 310 and 320 implemented in a balanced structure, the push-push VCO output is connected to a buffer amplifier A1 340. Wherein, the in-phase input node of the buffer amplifier A1 is connected to the junction between the third resistor R3 and the fifth inductor L5 of the first single-ended voltage controlled oscillator, and the anti-phase input node of the buffer amplifier A1 is connected to the junction between the third resistor R3 and the fifth inductor L5 of the second single-ended voltage controlled oscillator. Wherein, in the push-push VCO structure, the ground between the two first capacitors C1 is a first virtual ground 331, the ground between the two second capacitors C2 is a second virtual ground 332, and the ground between the two fifth capacitors C5 is a third virtual ground 333, which inherently suppresses odd harmonics. In some embodiments, the first virtual ground, the second virtual ground, and the third virtual ground are difference from each other. In some embodiments, the first virtual ground, the second virtual ground and the third virtual ground are connected together. In addition to the push-push structure, many other oscillator topologies, such as differential cross-coupled topologies, may also be possible.

While this embodiment is in use, the differential signal should be received from the circuit between the third resistor R3 and the fifth inductor L5, amplified by the buffer amplifier A1 and output at the output node of the buffer amplifier A1.

Embodiment 4:

This embodiment makes further restrictions as follows on the basis of embodiment 3. The said negative resistance circuit of this embodiment further includes the first resistor R1, the second resistor R2, and the fourth inductor L4. Wherein, one end of the said fourth inductor L4 is connected to the junction between the third LC series resonance branch and the base of first NPN transistor Q1, while the other end is connected to the first resistor R1; opposite to the end of the said first resistor R1 which connects to the said inductor L4, the other end of the said first resistor R1 is connected to an external power supply VCC. In this embodiment, one end of the said second resistor R2 is connected to the junction between the first resistor R1 and the fourth inductor L4, while the other end is grounded.

The above said detailed descriptions of the preferred embodiments have further elaborated the purposes, technical scheme and beneficial effects of the invention. It should be understood that, all the above said are only the detailed descriptions of the preferred embodiments of the invention, and shall not constitute a restriction on the protection scope of the invention. Any amendments, substitutions to the same object and improvements that are within the spirits and principles of the invention shall fall within the protection scope of the invention.

The invention claimed is:
1. A voltage controlled oscillator (VCO) comprising:
a negative resistance circuit; and
a hybrid resonator comprising:
  a first resonance branch having a first resonance frequency, the first resonance branch comprising at least a first inductor and a first capacitor coupled in series, the first capacitor is a variable capacitor composed of one or more varactor diodes;
  a second resonance branch coupled in parallel to the first resonance branch, the second resonance branch comprising at least a second inductor and a second capacitor coupled in series, the second resonance branch having a second resonance frequency, the first resonance frequency being lower than the second resonance frequency, the second capacitor is a fixed capacitor; and
  a third resonance branch coupled between the negative resistance circuit and the parallel first and second resonance branches, the third resonance branch comprising at least a third inductor and a third capacitor coupled in series.

2. The voltage controlled oscillator (VCO) of claim 1, wherein the first resonance branch or the second resonance branch is a cascaded structure comprising multiple resonance cells, each resonance cell comprises a capacitor and an inductor connected in series.

3. The voltage controlled oscillator (VCO) of claim 1, wherein the second LC series resonance branch has a quality factor (Q value) higher than that of the first resonance branch.

4. The voltage controlled oscillator (VCO) of claim 1, wherein the first capacitor further comprises a switched capacitor controlled by switch, or a fixed capacitor in parallel to the one or more varactor diodes.

5. The voltage controlled oscillator (VCO) of claim 1, wherein the negative resistance circuit comprises a first NPN transistor having a base, a collector coupled to an external power supply, and an emitter, a fourth capacitor coupled between the base and the emitter, and a fifth capacitor coupled between the emitter and ground.

6. The voltage controlled oscillator (VCO) of claim 5, wherein the negative resistance circuit further comprises a fourth inductor with a first end and a second end, the first end coupled to third resonance branch, the second end coupled to the external power supply via a first resistor, the second end also grounded via a second resistor.

7. The voltage controlled oscillator (VCO) of claim 5, wherein the negative resistance circuit further comprises a sixth capacitor coupled between the collector of the first NPN transistor and ground.

8. A push-push voltage controlled oscillator (VCO) comprising:
a pair of single-ended VCOs coupled to each other in a balanced layout for a push-push structure, each single-ended VCO comprising:
  a negative resistance circuit; and
  a resonator comprising at least a first resonance branch and a second resonance branch coupled in parallel to the first resonance branch, the first resonance branch comprises a first inductor and a first capacitor, the second resonance branch comprises a second inductor and a second capacitor, the first capacitor being a variable capacitor composing from one or more varactor diodes, and the second capacitor being a fixed capacitor, the first resonance branch having a first resonance frequency lower than a second resonance frequency of the second resonance branch;
wherein the first resonance branches of both single-ended VCOs are coupled to each other, and the second resonance branches of both single-ended VCOs are coupled to each other.

9. The push-push VCO of claim 8 further comprising a buffer amplifier or a frequency multiplier coupled to each single-ended VCO, the buffer amplifier or a frequency multiplier receiving an output of each single-ended VCO and generating an output for the push-push VCO.

10. The VCO of claim 8, wherein the second resonance branch has a quality factor (Q value) higher than that of the first resonance branch.

11. The VCO of claim 8, wherein the resonator of each single-ended VCO further comprises a third resonance branch coupled between the negative resistance circuit and the parallel first and second resonance branches, the third resonance branch comprises at least a third inductor and a third capacitor.

12. The VCO of claim 8, wherein the negative resistance circuit of each single-ended VCO comprises a first NPN transistor having a base, a collector coupled to an external power supply, and an emitter, a fourth capacitor coupled between the base and the emitter, and a fifth capacitor coupled between the emitter and a virtual ground.

13. The VCO of claim 12, wherein the first resonance branches of both single-ended VCOs are coupled to another virtual ground, the second resonance branches of both single-ended VCOs are coupled to a further other virtual ground, the virtual ground point, the another virtual ground and the further other virtual ground are different from each other or connected together.

14. A method to maintain low phase noise of a voltage controlled oscillator (VCO), the method comprising:
coupling a first resonance branch and a second resonance branch into a parallel structure, the first resonance branch having a first resonance frequency range between a low end and a high end, the second resonance branch having a second resonance frequency, the first resonance frequency range being lower than the second resonance frequency, the first resonance branch comprising a first inductor and a first variable capacitor coupled in series, the second resonance branch comprising a second inductor and a second capacitor coupled in series; and coupling a third resonance branch between the parallel structure and a negative resistance circuit within the VCO, the third resonance branch comprising a third inductor and a third capacitor coupled in series;

wherein the VCO has an overall quality factor (Q value) dominated by the first resonance branch when the VCO operates near the low end of the first resonance frequency range, the second resonance branch contributes more to the overall Q value when the VCO operates near the high end of the first resonance frequency range than when the VCO operates near the low end of the first resonance frequency range.

15. The method of claim 14, wherein the second resonance branch has a quality factor (Q value) higher than that of the first resonance branch.

16. The method of claim 14 further comprising coupling an output of the VCO to a buffer amplifier or a frequency multiplier, the buffer amplifier or a frequency multiplier further is coupled to an additional VCO with the same structure of the VCO, the VCO and additional VCO are coupled in a balanced layout to form a push-push VCO, the buffer amplifier or the frequency multiplier generating an output for the push-push VCO.

17. The method of claim 16 wherein the first resonance branch and the second resonance branch of the VCO and the additional VCO are coupled to a virtual ground.

18. The method of claim 14 further comprising coupling the third resonance branch to an external power supply via a resistor and a fourth inductor.

* * * * *